United States Patent
Yoshikawa et al.

(10) Patent No.: US 9,508,922 B2
(45) Date of Patent: Nov. 29, 2016

(54) MAGNETIC MEMORY DEVICE AND METHOD OF MANUFACTURING THE SAME

(71) Applicants: Masatoshi Yoshikawa, Seoul (KR); Satoshi Seto, Seoul (KR); Shuichi Tsubata, Seoul (KR); Kazuhiro Tomioka, Seoul (KR)

(72) Inventors: Masatoshi Yoshikawa, Seoul (KR); Satoshi Seto, Seoul (KR); Shuichi Tsubata, Seoul (KR); Kazuhiro Tomioka, Seoul (KR)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 14/642,506

(22) Filed: Mar. 9, 2015

(65) Prior Publication Data

US 2016/0072050 A1    Mar. 10, 2016

Related U.S. Application Data

(60) Provisional application No. 62/047,529, filed on Sep. 8, 2014.

(51) Int. Cl.
H01L 43/08    (2006.01)
H01L 43/02    (2006.01)
H01L 43/12    (2006.01)

(52) U.S. Cl.
CPC .............. *H01L 43/08* (2013.01); *H01L 43/02* (2013.01); *H01L 43/12* (2013.01)

(58) Field of Classification Search
CPC ...... H01L 43/08; H01L 43/02; H01L 43/122
See application file for complete search history.

(56) References Cited

U.S. PATENT DOCUMENTS

| 8,716,818 | B2 | 5/2014 | Yoshikawa et al. | |
| 8,956,882 | B1* | 2/2015 | Tomioka | H01L 43/12 438/3 |
| 2010/0073827 | A1* | 3/2010 | Zhao | B82Y 10/00 360/324.2 |
| 2012/0248557 | A1* | 10/2012 | Liu | H01L 43/08 257/421 |
| 2014/0087483 | A1 | 3/2014 | Ohsawa et al. | |
| 2015/0069556 | A1* | 3/2015 | Yamakawa | H01L 43/02 257/421 |
| 2015/0249206 | A1* | 9/2015 | Kim | H01L 43/08 257/421 |
| 2015/0255507 | A1* | 9/2015 | Pakala | H01L 27/228 257/421 |

FOREIGN PATENT DOCUMENTS

JP    2013065755 A    4/2013

OTHER PUBLICATIONS

U.S. Appl. No. 14/593,611, filed Jan. 9, 2015, First Named Inventor: Hiroyuki Kanaya, Title: "Magnetic Memory and Method for Manufacturing the Same".

* cited by examiner

*Primary Examiner* — Fernando L Toledo
*Assistant Examiner* — Neil Prasad
(74) *Attorney, Agent, or Firm* — Holtz, Holtz & Volek PC

(57) ABSTRACT

According to one embodiment, a magnetic memory device includes a first stack structure including a first magnetic layer, and a first nonmagnetic layer provided on the first magnetic layer, a second stack structure including a second magnetic layer provided on the first nonmagnetic layer, a second nonmagnetic layer provided on the second magnetic layer, and a top conductive layer provided on the second nonmagnetic layer, and a sidewall conductive layer provided on a sidewall of the second stack structure.

25 Claims, 13 Drawing Sheets

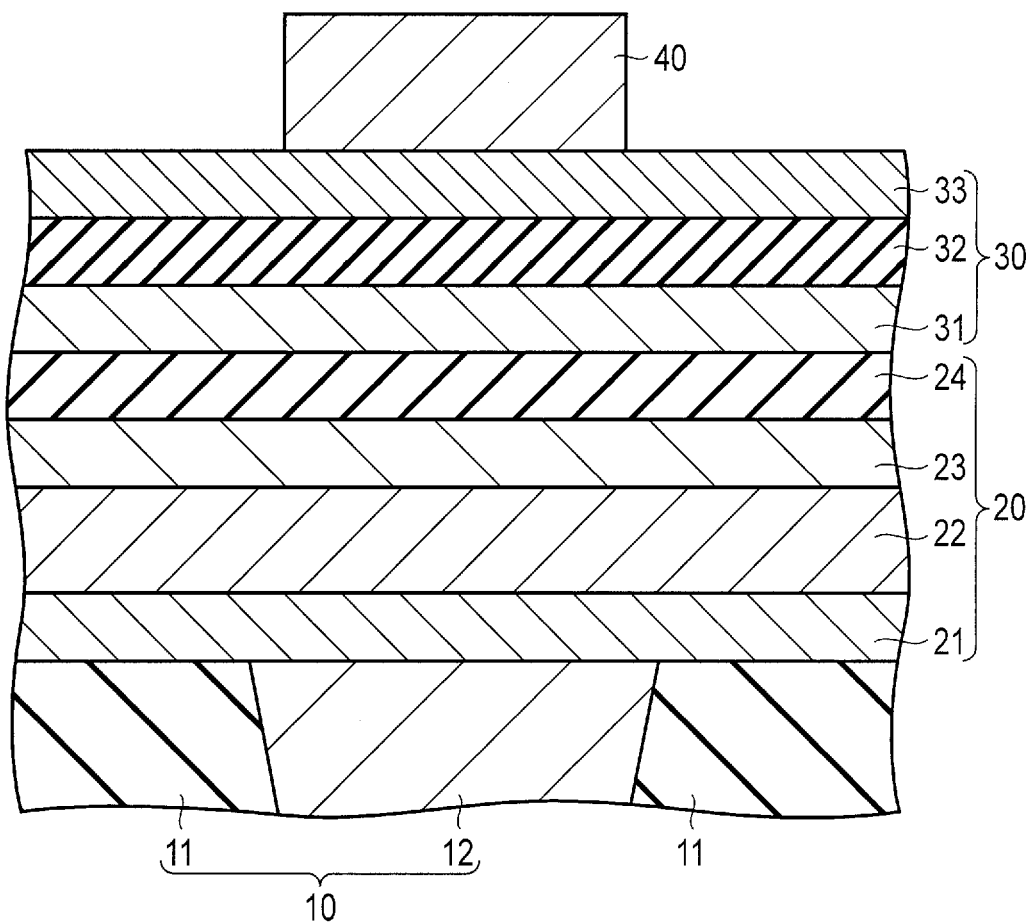
F I G. 1

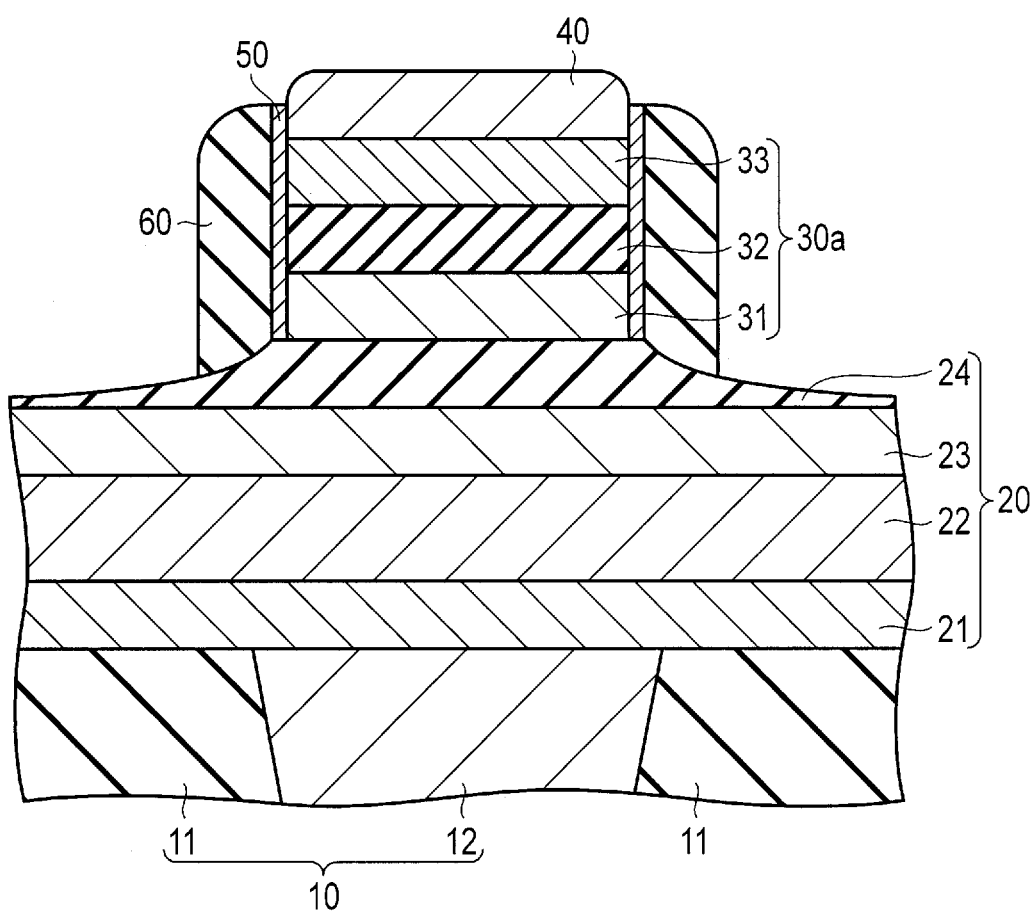
F I G. 3

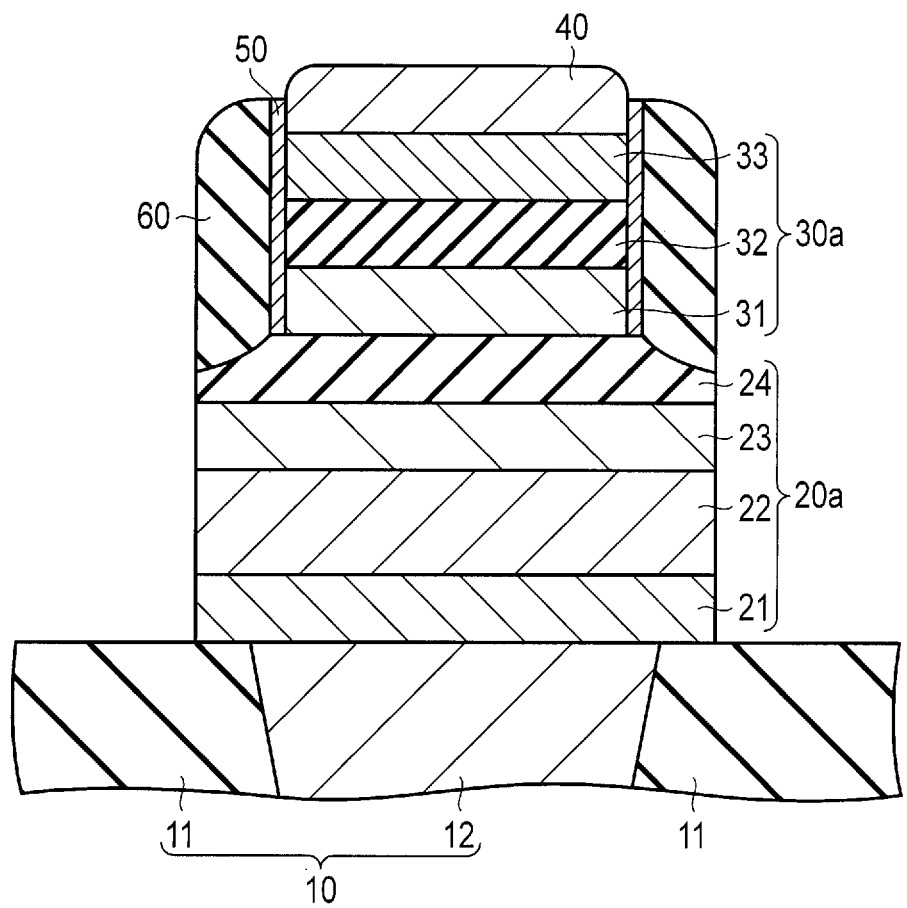
F I G. 4

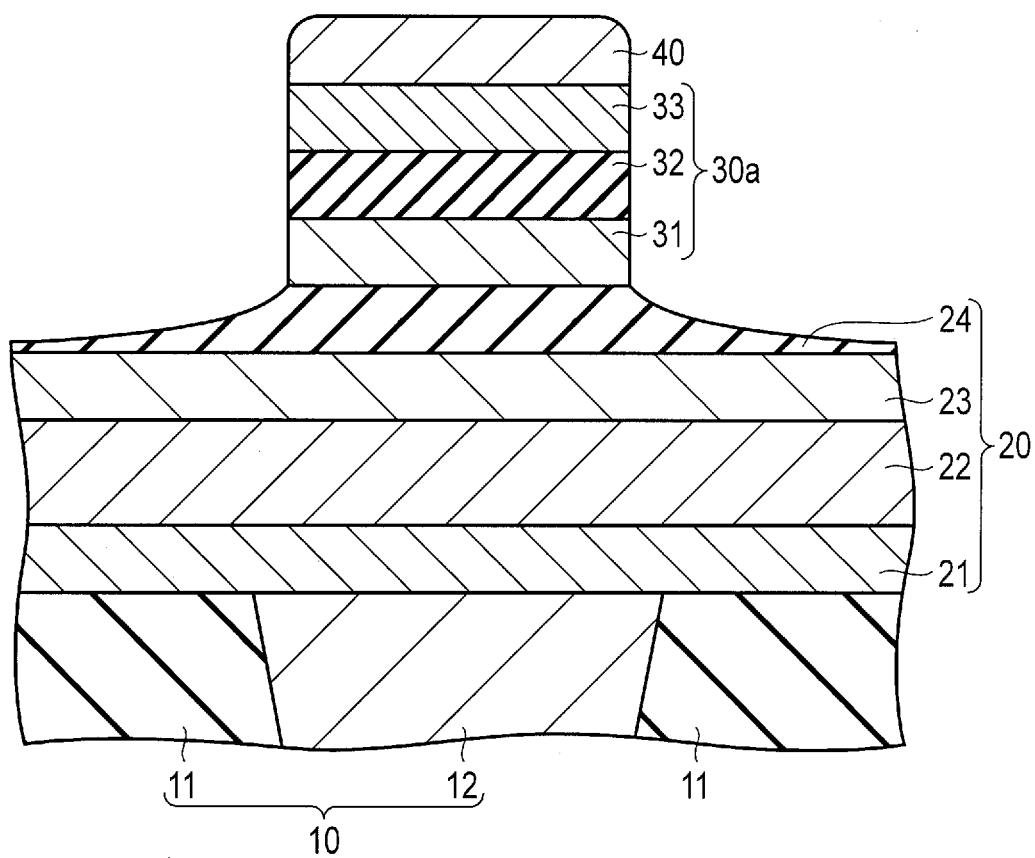
F I G. 7

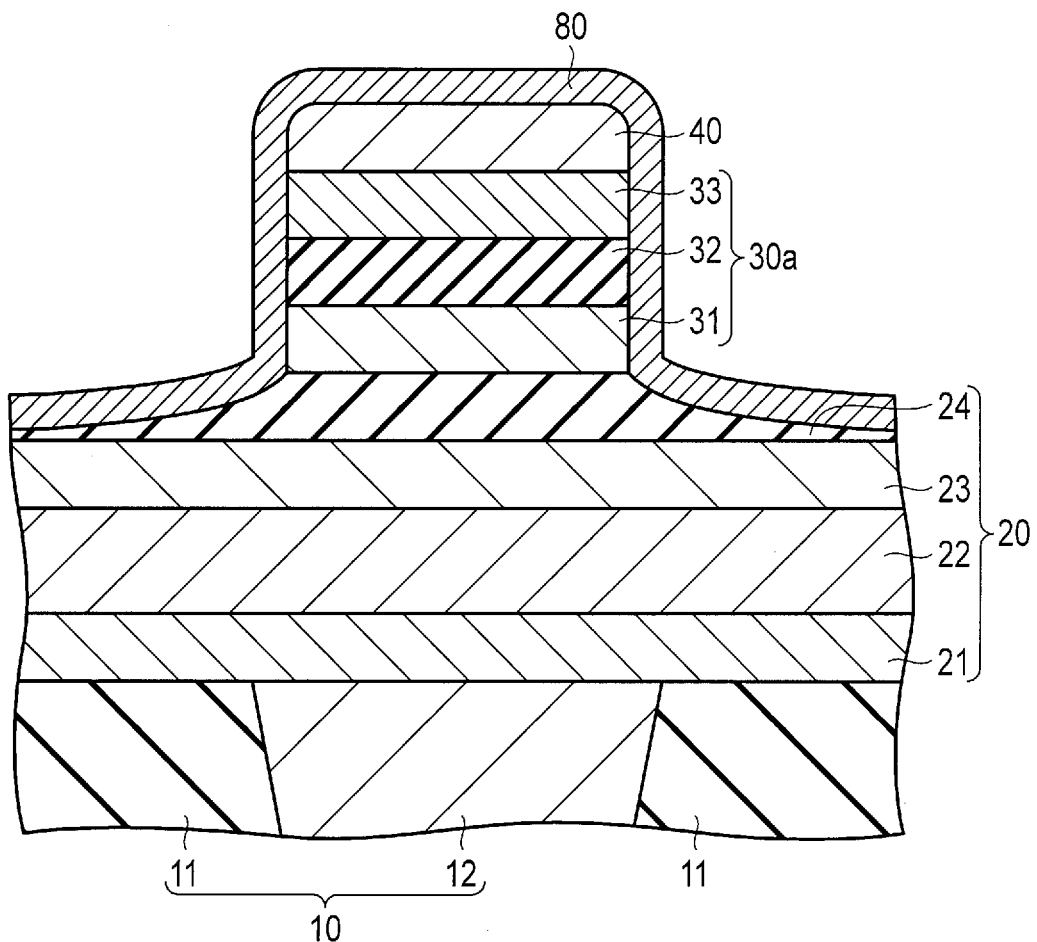
F I G. 8

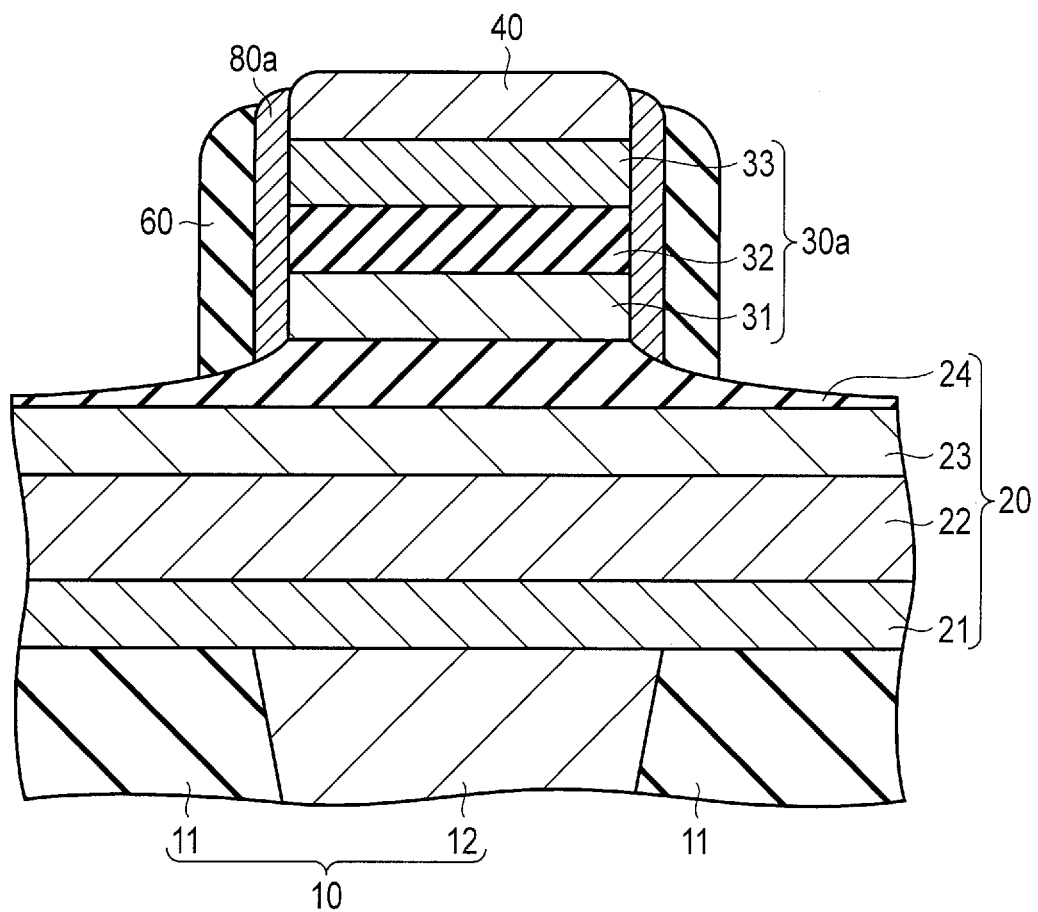
F I G. 10

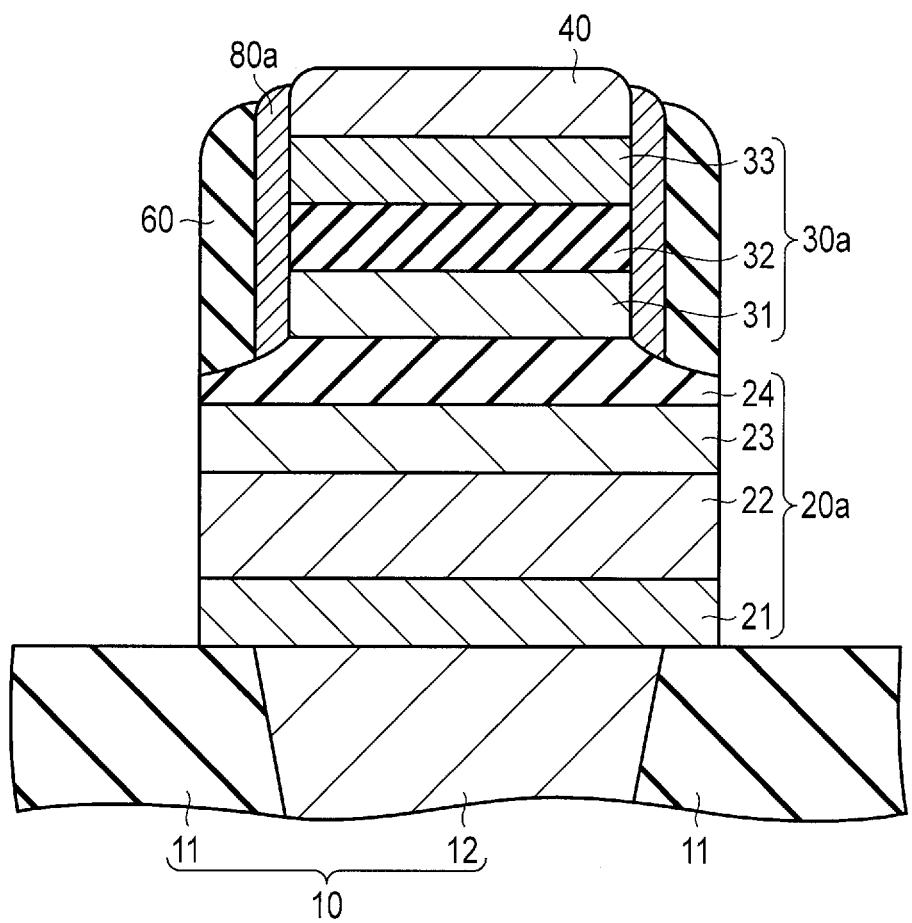
F I G. 11

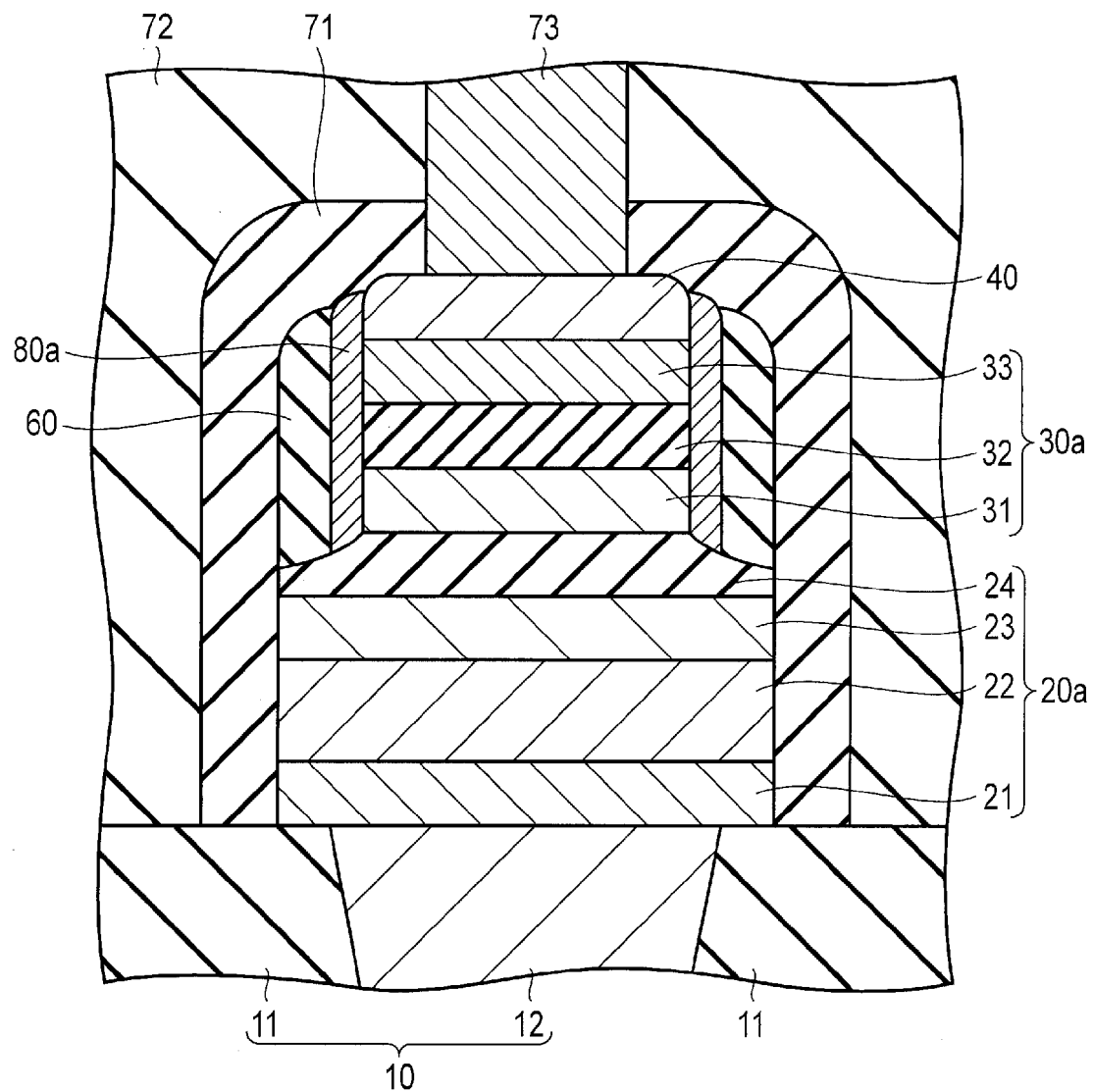
F I G. 12

MAGNETIC MEMORY DEVICE AND METHOD OF MANUFACTURING THE SAME

CROSS-REFERENCE TO RELATED APPLICATIONS

This application claims the benefit of U.S. Provisional Application No. 62/047,529, filed Sep. 8, 2014, the entire contents of which are incorporated herein by reference.

FIELD

Embodiments described herein relate generally to a magnetic memory device, and a manufacturing method of the same.

BACKGROUND

A semiconductor integrated circuit device (magnetic memory device) using a magnetoresistive effect element as a memory element has been proposed. To enhance perpendicular magnetization anisotropy, a structure in which a storage layer is held between tunnel barrier layers has been proposed as the structure of the magnetoresistive effect element.

However, since the above structure employs two tunnel barrier layers, it has a high parasitic resistance. This inevitably reduces the MR ratio and makes it difficult to obtain a magnetic memory device of excellent characteristics.

Therefore, in magnetic memory devices having a structure in which a storage layer is held between tunnel barrier layers, there is a demand for a structure and a manufacturing method capable of realizing excellent characteristics.

BRIEF DESCRIPTION OF THE DRAWINGS

FIG. 1 is a schematic cross-sectional view showing part of a magnetic storage device manufacturing method according to a first embodiment;

FIG. 3 is a schematic cross-sectional view showing part of the magnetic storage device manufacturing method according to the first embodiment;

FIG. 4 is a schematic cross-sectional view showing part of the magnetic storage device manufacturing method according to the first embodiment;

FIG. 7 is a schematic cross-sectional view showing part of the magnetic storage device manufacturing method according to the second embodiment;

FIG. 8 is a schematic cross-sectional view showing part of the magnetic storage device manufacturing method according to the second embodiment;

FIG. 10 is a schematic cross-sectional view showing part of the magnetic storage device manufacturing method according to the second embodiment;

FIG. 11 is a schematic cross-sectional view showing part of the magnetic storage device manufacturing method according to the second embodiment;

FIG. 12 is a schematic cross-sectional view showing part of the magnetic storage device manufacturing method according to the second embodiment.

DETAILED DESCRIPTION

Figure 2:
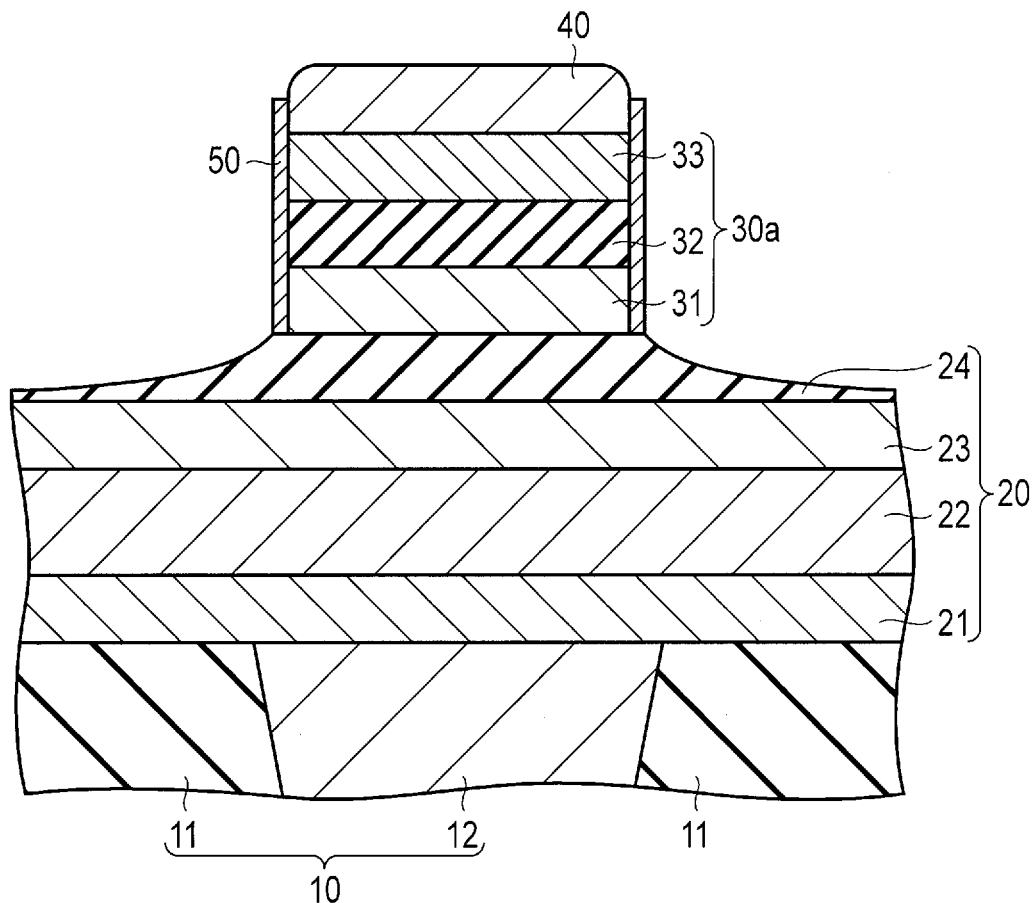
FIG. 2 is a schematic cross-sectional view showing part of the magnetic storage device manufacturing method according to the first embodiment.

In general, according to one embodiment, a magnetic memory device includes: a first stack structure including a first magnetic layer, and a first nonmagnetic layer provided on the first magnetic layer; a second stack structure including a second magnetic layer provided on the first nonmagnetic layer, a second nonmagnetic layer provided on the second magnetic layer, and a top conductive layer provided on the second nonmagnetic layer; and a sidewall conductive layer provided on a sidewall of the second stack structure.

First Embodiment

FIGS. 1 to 5 are schematic cross-sectional views showing a method of manufacturing a magnetic memory device (semiconductor integrated circuit device) according to a first embodiment.

Firstly, as shown in FIG. 1, an underlying area 10 is formed on a semiconductor substrate (not shown). The underlying area 10 includes an interlayer insulating film 11 and a bottom electrode 12 formed in the interlayer insulating film 11. Transistors, such as a selective transistor (not shown) for selecting a magnetoresistive effect element, are formed in the surface area of the semiconductor substrate. In the description below, the magnetoresistive effect element will also be referred to as a magnetic tunnel junction (MTJ) element.

Subsequently, a first stack film 20 is formed on the underlying area 10. The first stack film 20 comprises an under layer 21, a shift canceling layer (third magnetic layer) 22 provided on the under layer 21, a reference layer (first magnetic layer) 23 provided on the shift canceling layer and having a fixed magnetization, and a tunnel barrier layer (first non-magnetic layer) 24 formed on the reference layer 23.

After that, a second stack film 30 is formed on the first stack film 20. The second stack film 30 comprises a storage layer (second magnetic layer) 31 provided on the tunnel barrier layer 24 and having a variable magnetization, a tunnel barrier layer (second non-magnetic layer) 32 provided on the storage layer 31, and a cap layer (top conductive layer) 33 provided on the tunnel barrier layer 32.

The storage layer 31 comprises a magnetic layer containing Co, Fe or Ni. For instance, it comprises a CoFeB layer or a CoFe layer. In the first embodiment, the storage layer 31 comprises the CoFeB layer. The reference layer 23 comprises a magnetic layer containing Co, Fe or Ni. The reference layer 23 may comprise an interface layer contacting the tunnel barrier layer, and a lower magnetic layer. The interface layer comprises a magnetic layer containing Co, Fe or Ni. The lower magnetic layer comprises a magnetic layer that contains Co, Fe or Ni, and Pt, Pd, Ru or Ir. For instance, the interface layer comprises a CoFeB layer or a CoFe layer, and the lower magnetic layer comprises a CoPt layer, a Co/Pt multi-layered film or a FePt layer. In the first embodiment, the reference layer 23 comprises a stack film of a CoPt layer and a CoFeB layer. The shift canceling layer 22 comprises a magnetic layer that contains Co, Fe or Ni, and Pt, Pd, Ru or Ir. In the first embodiment, the shift canceling layer 22 comprises a CoPt layer. The tunnel barrier layers 24 and 32 are formed of an oxide or nitride containing Mg or Al. In the first embodiment, the tunnel barrier layers 24 and 32 each comprise an MgO layer. Further, the cap layer 33 comprises a stacked film of Ru and Ta.

Subsequently, the pattern of a hard mask layer 40 is formed on the cap layer 33. The hard mask layer 40 comprises a W layer, a TiN layer, a Ta layer, a TaN layer, a WN layer, a TaC layer, a TiC layer, a WC layer, a diamond-like-carbon (DLC) layer, an SiC layer, etc. In the first embodiment, the hard mask layer 40 comprises a W layer.

After that, as shown in FIG. 2, the second stack film 30 is etched using the hard mask layer 40 as an etching mask. As a result, a second stacked structure 30a is formed. By the same process as this etching process, sidewall conductive layers 50 electrically connected to the storage layer 31 and the cap layer 33 are formed on the sidewall of the second stack structure 30a. Namely, the forming of the sidewall conductive layer 50 on the sidewall of the second stack structure 30a is performed in parallel with the forming of the second stack structure 30a by etching the second stack film 30. This process will now be described in detail.

The etching process shown in FIG. 2 is performed by ion beam etching (IBE). As an ion beam, an argon (Ar) beam, for example, is used. However, as the ion beam, an Ne, Kr or Xe beam, or a beam of a mixture of these gases, can be also used. The ion beam is obliquely applied to the second stack film 30. More specifically, the ion beam is applied to the second stack film 30 for etching at an angle of 0 to 45° with respect to the direction parallel to the stack direction of the first and second stack films 20 and 30 (i.e., perpendicularly to the substrate surface), more preferably, 0 to 30°. The angle of the ion beam can be adjusted appropriately.

Further, when a CoFeB storage layer on a MgO tunnel barrier layer is etched as in the embodiment, it is preferable to use an Ar or Ne gas, or a mixture of these gasses, in view of enhancing the etching selectivity between the MgO layer and the CoFeB layer.

Where the application angle of the ion beam is about 45° or more, even if product materials resulting from the ion beam etching have once stuck to the sidewall of the second stack structure 30a, they will instantly separate therefrom by the ion beam sputtering effect. In other words, the product materials resulting from the ion beam etching will not substantially stick to the sidewall of the second stack structure 30a. In contrast, if the ion beam is applied to the second stack film 30 at a small application angle as in the first embodiment, the conductive substance generated by the ion beam etching will be deposited on the sidewall of the second stack structure 30a. As a result, the sidewall conductive layer 50 is formed on the sidewall of the second stack structure 30a.

In the above-described ion beam etching process, the tunnel barrier layer (MgO layer) 24 functions as an etching stopper. Namely, in the above-described etching process, it is preferable to stop etching by means of the tunnel barrier layer. This is because of preventing short-circuiting. Since, however, the tunnel barrier layer 24 is also etched in general, it is tapered. It is preferable that the angle of the taper be very small.

Further, in the first embodiment, to enhance the etching selectivity between the MgO tunnel barrier layer and the CoFeB layer, it is effective to perform etching with a gas, such as $O_2$ or $N_2$, added.

By virtue of the above-mentioned etching method in which etching is stopped by the tunnel barrier layer (first nonmagnetic layer) 24, sidewall layer can be formed on the sidewall of the tunnel barrier layer (second nonmagnetic layer) 32, without forming sidewall layer on the sidewall of the tunnel barrier layer (first nonmagnetic layer) 24.

Since the sidewall conductive layer 50 is formed of product materials resulting from the etching of the second stack film 30, they contain a metal element that is also contained in the second stack structure 30a. Further, in the above-mentioned ion beam etching, etching advances from the upper portion of the second stack film 30 to the lower portion of the same. Therefore, a relatively greater amount of constituents in the upper-layer side of the second stack film 30 is contained in the inner side of each sidewall conductive layer 50, and a relatively greater amount of constituents in the lower-layer side of the second stack film 30 is contained in the outer side of each sidewall conductive layer 50.

The thickness and composition of each sidewall conductive layer 50 can be adjusted by adjusting the angle of the ion beam. For instance, if the angle is not more than 45°, the forming of the sidewall layers is accelerated, while if the angle is more than 45°, the forming of the sidewall layers is suppressed. Thus, by adjusting the combination of angles of the ion beam, the thickness and composition of each sidewall conductive layer 50 can be adjusted.

After that, as shown in FIG. 3, a sidewall insulating film 60 is formed on a sidewall of the sidewall conductive layer 50. More specifically, firstly, an insulating film is formed on the entire surface of the structure to cover the second stack structure 30a, the hard mask layer 40 and the sidewall conductive layer 50. Subsequently, anisotropic etching is performed to leave the insulation film only on the sidewall of the sidewall conductive layer 50, thereby forming the sidewall insulating film 60.

Thereafter, as shown in FIG. 4, the first stack film 20 is etched to form a first stack structure 20a, using, as masks, the second stack structure 30a, the hard mask layer 40, the sidewall conductive layer 50 and the sidewall insulating film 60.

Figure 5:
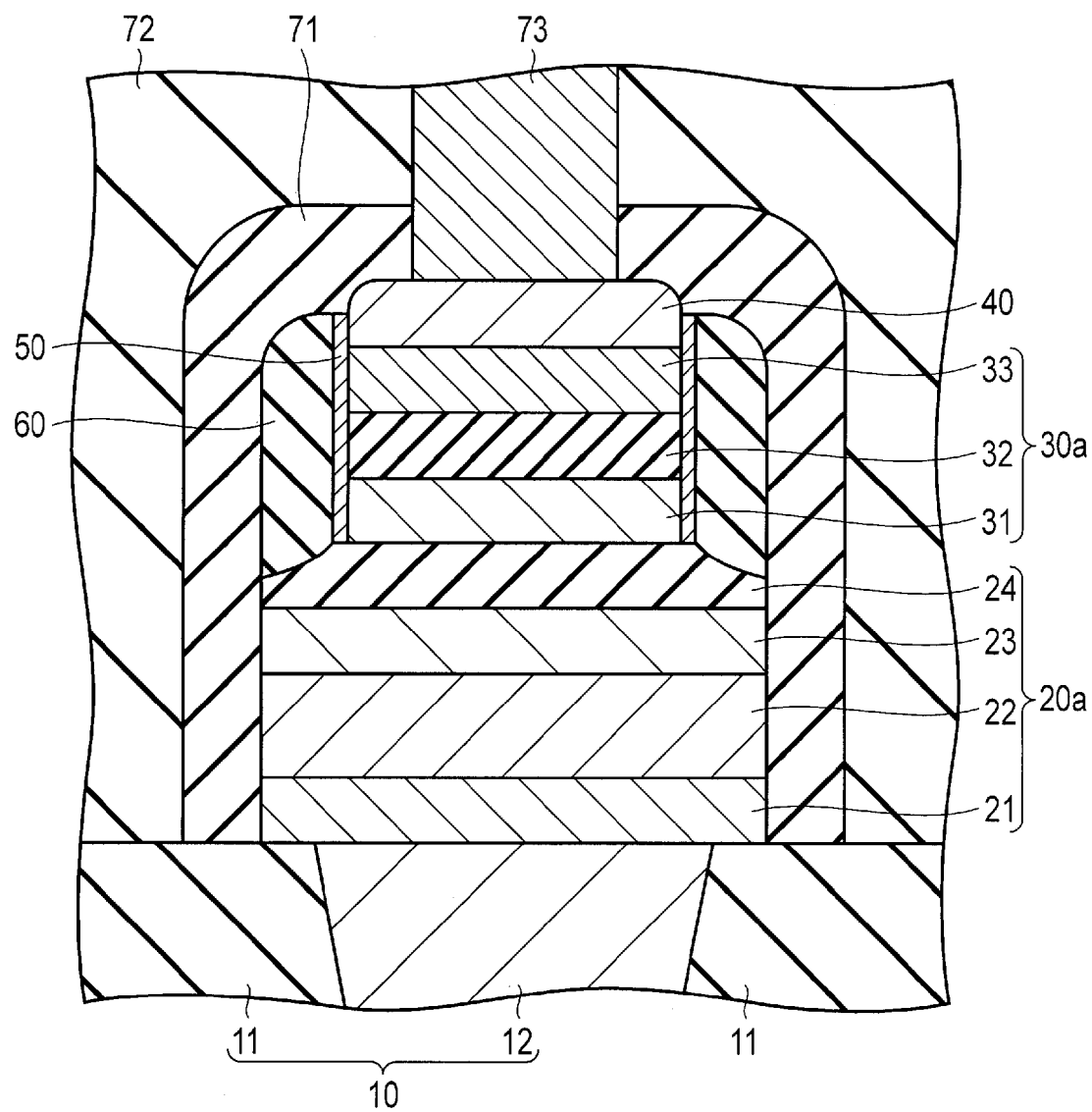
FIG. 5 is a schematic cross-sectional view showing part of the magnetic storage device manufacturing method according to the first embodiment.

Thereafter, as shown in FIG. 5, a protective insulating film 71 is formed to cover the first stack structure 20a, the second stack structure 30a, the hard mask layer 40, the sidewall conductive layer 50 and the sidewall insulating film 60. An interlayer insulating film 72 is then formed to cover the protective insulating film 71. A hole is formed in the protective insulating film 71 and the interlayer insulating film 72 to form a top electrode 73 in the hole.

As described above, a magnetic memory device as shown in FIG. 5 is formed. Namely, a magnetic memory device, which includes a magnetoresistive effect element (MTJ element) having a structure in which the storage layer 31 is held between two tunnel barrier layers 24 and 32, is formed. As shown in FIG. 5, when viewed from a direction parallel to a stack direction of the first and second stack structures 20a and 30a, the first stack structure 20a includes a portion positioned outside the second stack structure 30a and the sidewall conductive layer 50.

The above-mentioned MTJ element is a magnetic element having perpendicular magnetization. Namely, the magnetization direction of the storage layer 31, the reference layer 23 and the shift canceling layer 22 is perpendicular to the surfaces thereof. If the magnetization direction of the storage layer 31 is parallel to that of the reference layer 23, the MTJ element assumes a low resistance state. In contrast, if the magnetization direction of the storage layer 31 is antiparallel to that of the reference layer 23, the MTJ element assumes a high resistance state. Binary data (0 or 1) can be stored depending upon whether the MTJ element assumes the low or high resistance state. Further, binary data (0 or 1) can be written depending upon the direction of the current flowing through the MTJ element.

As described above, in the first embodiment, the sidewall conductive layer 50 that electrically connects the storage layer 31 to the cap layer 33 are formed on the sidewall of the second stack structure 30a. Accordingly, a current can be flown between the storage layer 31 and the cap layer 33 via the sidewall conductive layer 50. As a result, the current between the storage layer 31 and the cap layer 33 will not be limited by the parasitic resistance that occurs due to the tunnel barrier layer 32. This structure enables the magnetic memory device of a structure, in which the storage layer 31 is held between the two tunnel barrier layers 24 and 32, to have a large MR ratio and hence excellent characteristics.

Further, in the first embodiment, the sidewall conductive layer 50 can be formed simultaneously with the second stack structure 30a by the etching process for forming the second stack structure 30a. Thus, the sidewall conductive layer 50 can be formed without adding any particular process.

Second Embodiment

FIGS. 6 to 12 are schematic cross-sectional views showing a method of manufacturing a magnetic memory device according to a second embodiment. Since the second embodiment is similar to the first embodiment in basic structure and basic manufacturing method, description of the matters described in the first embodiment will be omitted.

Figure 6:
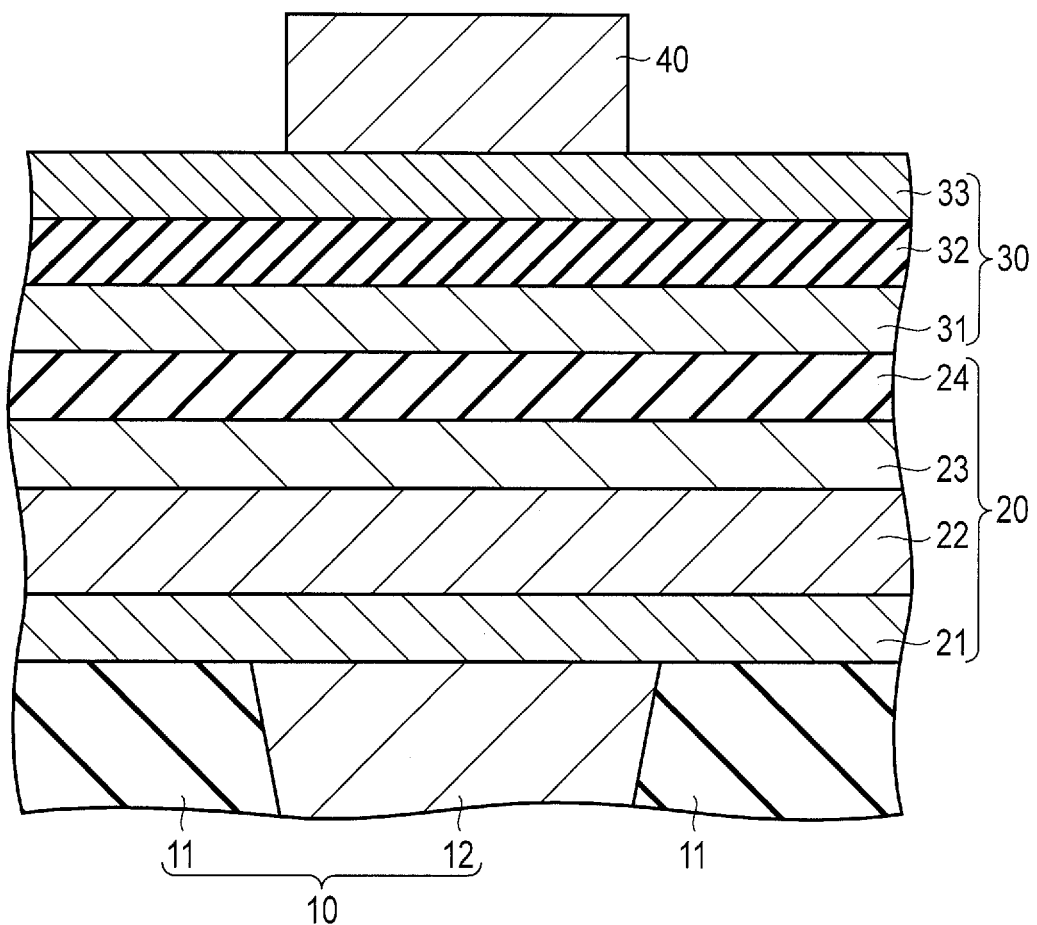
FIG. 6 is a schematic cross-sectional view showing part of a magnetic storage device manufacturing method according to a second embodiment.

Firstly, as shown in FIG. 6, a first stack film 20 and a second stack film 30 are formed on an underlying area 10 as in the first embodiment, thereby forming a hard mask layer 40 on the second stack film 30. The first stack film 20, the second stack film 30 and the hard mask layer 40 are formed of the same materials as those in the first embodiment.

Subsequently, as shown in FIG. 7, the second stack film 30 is etched using the hard mask layer 40 as an etching mask. As a result, the second stack structure 30a is formed. Also in the second embodiment, etching is IBE. However, the ion-beam application angle is greater than in the first embodiment. More specifically, an ion beam is applied to the second stack film 30 at an angle not smaller than 45° with respect to an axis along which the first and second stack films 20 and 30 are stacked. Therefore, etching product materials do not stick to the sidewall of the second stack structure 30a, unlike the first embodiment. Also in this process, the tunnel barrier layer (MgO layer) 24 functions as an etching stopper.

After that, as shown in FIG. 8, a metal film serving as a conductive layer 80 is formed on the entire surface of the resultant structure. As a result, the conductive layer 80 is formed on the upper and side surfaces of the second stack structure 30a and on the upper surface of the tunnel barrier layer 24. It is preferable that the conductive layer 80 contain a metal element that is also contained in the tunnel barrier layer 24. For instance, if the tunnel barrier layer 24 is formed of MgO, the conductive layer 80 preferably contains Mg.

Figure 9:
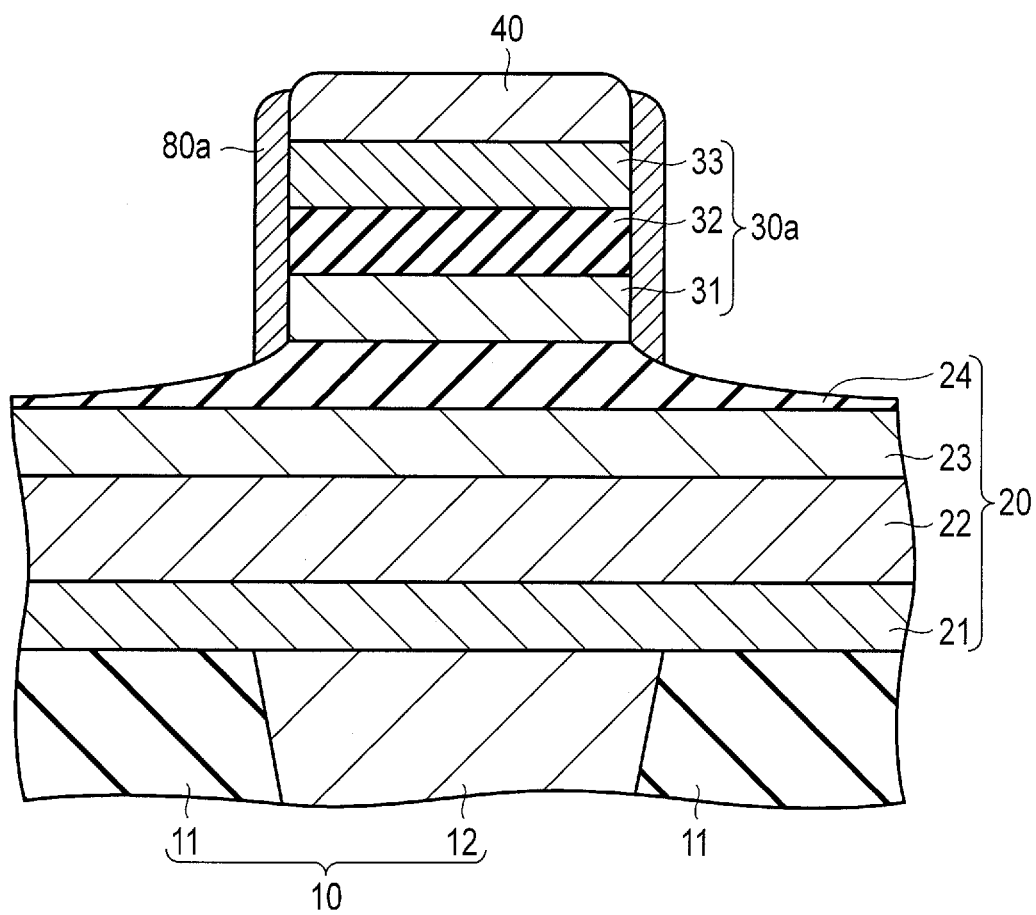
FIG. 9 is a schematic cross-sectional view showing part of the magnetic storage device manufacturing method according to the second embodiment.

Thereafter, as shown in FIG. 9, the conductive layer 80 is subjected to anisotropic etching. As a result, the portions of the conductive layer 80 formed on the upper surface of the second stack structure 30a and on the upper surface of the tunnel barrier layer 24 are removed by the etching, whereby the portion of the conductive layer 80 formed on the sidewall of the second stack structure 30a are left. Thus, sidewall conductive layer 80a that electrically connect the storage layer 31 to the cap layer 33 are formed on the sidewall of the second stack structure 30a.

Subsequently, as shown in FIG. 10, sidewall insulating film 60 is formed on a sidewall of the sidewall conductive layer 80a as in the first embodiment.

After that, as shown in FIG. 11, the first stack film 20 is etched, using, as masks, the second stack structure 30a, the hard mask layer 40, the sidewall conductive layer 80a and the sidewall insulating film 60, as in the first embodiment. As a result, a first stack structure 20a is formed.

After that, as shown in FIG. 12, the protective insulating film 71, the interlayer insulating film 72 and the top electrode 73 are formed as in the first embodiment.

By the above-described process, a magnetic memory device as shown in FIG. 12 is formed. Namely, a magnetic memory device, which includes a magnetoresistive effect element (MTJ element) having a structure in which the storage layer 31 is held between two tunnel barrier layers 24 and 32, is formed.

Also in the second embodiment, the sidewall conductive layer 80a that electrically connects the storage layer 31 to the cap layer 33 is formed on the sidewall of the second stack structure 30a. Accordingly, the current between the storage layer 31 and the cap layer 33 will not be limited by the parasitic resistance that occurs due to the tunnel barrier layer 32. This structure enables the magnetic memory device to have a large MR ratio and hence excellent characteristics, as in the first embodiment.

Although in the second embodiment, no etching product material is deposited on the sidewall of the second stack structure 30a in the process of FIG. 7, etching product materials may be deposited on the sidewall of the second stack structure 30a as in the first embodiment. The sidewall conductive layer 80a may be formed on the sidewall with etching product materials deposited thereon.

Figure 13:
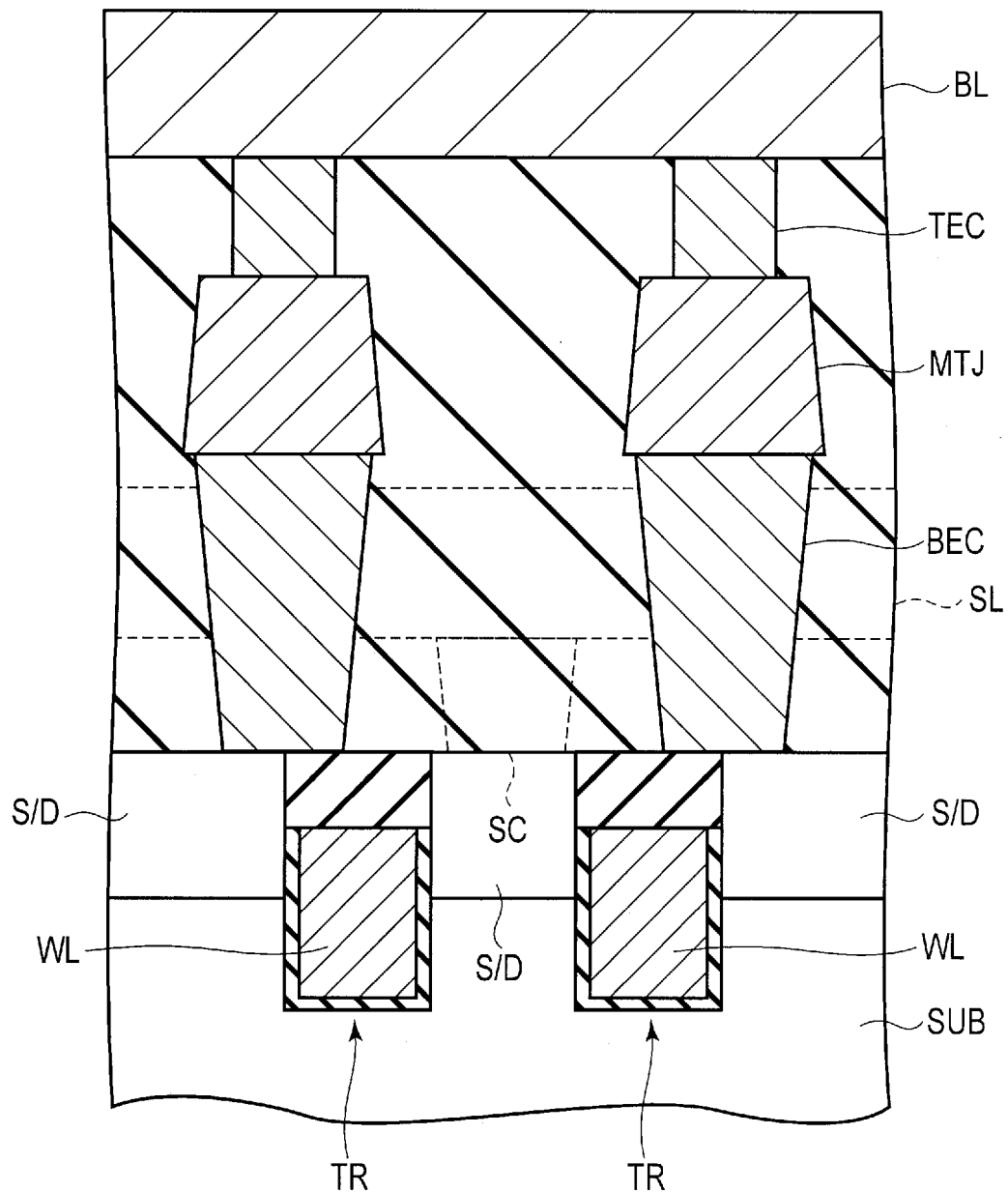
FIG. 13 is a view schematically showing a general structure of a semiconductor integrated circuit device in which a magnetoresistive effect element (MTJ element) is employed.

FIG. 13 is a view schematically showing a general structure of a semiconductor integrated circuit device in which a magnetoresistive effect element (MTJ element) is employed.

A buried gate type MOS transistor TR is formed in a semiconductor substrate SUB. A gate electrode of the MOS transistor TR is used as a word line WL. A bottom electrode BEC is connected to one of source/drain regions S/D of the MOS transistor TR, and a source line contact SC is connected to the other of the source/drain regions S/D.

A magnetoresistive effect element MTJ is formed on the bottom electrode BEC, and a top electrode TEC is formed on the magnetoresistive effect element MTJ. A bit line BL is connected to the top electrode TEC. A source line SL is connected to the source line contact SC.

An excellent semiconductor integrated circuit device can be obtained by applying the structure and the method described in each of the above embodiments to the semiconductor integrated circuit device shown in FIG. 13.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
   a first stack structure including a first magnetic layer, and a first nonmagnetic layer provided on the first magnetic layer;
   a second stack structure including a second magnetic layer provided on the first nonmagnetic layer, a second nonmagnetic layer provided on the second magnetic layer, and a top conductive layer provided on the second nonmagnetic layer; and
   a sidewall conductive layer provided on a sidewall of the second stack structure, wherein the sidewall conductive layer is not provided on a sidewall of the first stack structure.

2. The device of claim 1, wherein the first magnetic layer has a fixed magnetization, and the second magnetic layer has a variable magnetization.

3. The device of claim 1, wherein the sidewall conductive layer electrically connects the second magnetic layer to the top conductive layer.

4. The device of claim 1, wherein the sidewall conductive layer contains a metal element contained in the second stack structure.

5. The device of claim 1, wherein the sidewall conductive layer contains a metal element contained in the first nonmagnetic layer.

6. The device of claim 1, wherein the first stack structure includes a portion positioned outside the second stack structure when viewed from a direction parallel to a stack direction of the first stack structure and the second stack structure.

7. The device of claim 1, wherein the first stack structure includes a portion positioned outside the second stack structure and the sidewall conductive layer when viewed from a direction parallel to a stack direction of the first stack structure and the second stack structure.

8. The device of claim 1, further comprising a sidewall insulating film provided on a sidewall of the sidewall conductive layer.

9. The device of claim 1, wherein:
   the first stack structure further includes a third magnetic layer; and
   the first magnetic layer is provided on the third magnetic layer.

10. The device of claim 1, further comprising a hard mask layer provided on the top conductive layer.

11. A method of manufacturing a magnetic memory device, comprising:
    forming a first stack film including a first magnetic layer and a first nonmagnetic layer provided on the first magnetic layer;
    forming a second stack film including a second magnetic layer provided on the first nonmagnetic layer, a second nonmagnetic layer provided on the second magnetic layer and a top conductive layer provided on the second nonmagnetic layer; and
    etching the second stack film to form a second stack structure;
    forming a sidewall conductive layer on a sidewall of the second stack structure; and
    etching the first stack film to form a first stack structure, wherein the sidewall conductive layer is formed on the sidewall of the second stack structure, and is not formed on a sidewall of the first stack structure.

12. The method of claim 11, wherein the first magnetic layer has a fixed magnetization, and the second magnetic layer has a variable magnetization.

13. The method of claim 11, wherein the sidewall conductive layer electrically connects the second magnetic layer to the top conductive layer.

14. The method of claim 11, wherein:
    the forming the sidewall conductive layer on the sidewall of the second stack structure is performed in parallel with the etching the second stack film to form the second stack structure; and
    the sidewall conductive layer is formed of a conductive material generated by etching the second stack film.

15. The method of claim 14, wherein the sidewall conductive layer contains a metal element contained in the second stack structure.

16. The method of claim 11, wherein the forming the sidewall conductive layer on the sidewall of the second stack structure includes:
    forming a conductive layer on an upper surface and the sidewall of the second stack structure; and
    removing a portion of the conductive layer formed on the upper surface of the second stack structure to leave a portion of the conductive layer formed on the sidewall of the second stack structure.

17. The method of claim 16, wherein the sidewall conductive layer contains a metal element contained in the first nonmagnetic layer.

18. The method of claim 11, wherein the etching the second stack film is performed by IBE.

19. The method of claim 11, wherein the etching the second stack film is performed using, as an etching mask, a hard mask layer provided on the top conductive layer.

20. The method of claim 11, wherein the forming the first stack structure includes:
    forming a sidewall insulating film on a sidewall of the sidewall conductive layer; and
    etching the first stack film using, as masks, the second stack structure, the sidewall conductive layer and the sidewall insulating film.

21. The method of claim 11, wherein the first stack structure includes a portion positioned outside the second stack structure when viewed from a direction parallel to a stack direction of the first stack structure and the second stack structure.

22. The method of claim 11, wherein the first stack structure includes a portion positioned outside the second stack structure and the sidewall conductive layer when viewed from a direction parallel to a stack direction of the first stack structure and the second stack structure.

23. The method of claim 11, wherein:
    the first stack film further includes a third magnetic layer; and
    the first magnetic layer is provided on the third magnetic layer.

24. The device of claim 1, wherein the top conductive layer is not a magnetic layer.

25. The method of claim 11, wherein the top conductive layer is not a magnetic layer.

* * * * *